United States Patent [19]

Brigham

[11] 4,442,139
[45] * Apr. 10, 1984

[54] ELEMENTS COMPRISING FIBROUS MATERIALS

[75] Inventor: Alan Brigham, Sunnyvale, Calif.

[73] Assignee: Raychem Corporation, Menlo Park, Calif.

[*] Notice: The portion of the term of this patent subsequent to Jan. 31, 2001 has been disclaimed.

[21] Appl. No.: 102,576

[22] Filed: Dec. 11, 1979

[51] Int. Cl.³ .............................................. B05D 5/12
[52] U.S. Cl. ................... 427/122; 427/282; 427/287; 427/389.7; 427/389.8; 428/86; 428/87; 428/206; 428/283; 428/367; 428/408
[58] Field of Search ................ 428/87, 86, 88, 206, 428/367, 408, 283; 427/122, 282, 287, 389.8, 389.7, 389.9, 391, 272, 121

[56] References Cited

U.S. PATENT DOCUMENTS

| | | | |
|---|---|---|---|
| 1,872,581 | 8/1932 | Haroldson | 428/87 |
| 2,734,835 | 2/1956 | Florio et al. | 428/87 |
| 2,803,566 | 8/1957 | Smith-Johannsen . | |
| 2,891,228 | 6/1959 | Smith-Johannsen . | |
| 2,952,761 | 9/1960 | Smith-Johannsen . | |
| 2,991,257 | 7/1961 | Smith-Johannsen . | |
| 3,400,254 | 9/1968 | Takemori . | |
| 3,730,822 | 5/1973 | Lovell et al. | 428/87 |
| 3,837,988 | 9/1974 | Hennen et al. . | |
| 3,839,134 | 10/1974 | Fujihara . | |
| 3,859,504 | 1/1975 | Motokawa et al. . | |
| 3,876,968 | 4/1975 | Barnes . | |
| 3,900,654 | 8/1975 | Stinger . | |
| 4,084,031 | 4/1978 | Barsy . | |
| 4,158,078 | 6/1979 | Egger et al. . | |
| 4,169,911 | 10/1979 | Yoshida et al. . | |
| 4,185,137 | 1/1980 | Kinkel . | |

FOREIGN PATENT DOCUMENTS

| | | |
|---|---|---|
| 2232558 | 1/1974 | Fed. Rep. of Germany . |
| 2401203 | 7/1975 | Fed. Rep. of Germany . |
| 2515897 | 10/1976 | Fed. Rep. of Germany . |
| 1243898 | 8/1971 | United Kingdom . |
| 1283444 | 7/1972 | United Kingdom . |
| 1332395 | 10/1973 | United Kingdom . |
| 1383162 | 2/1975 | United Kingdom . |

*Primary Examiner*—James J. Bell
*Attorney, Agent, or Firm*—Lyon & Lyon

[57] ABSTRACT

An element comprises a support, preferably a continuous polymeric film, and fibrous material, preferably a spun glass fiber web, which is secured to the support and protrudes therefrom, the protruding fibrous material being part of a layer comprising randomly distributed fibers having solid material, especially particulate material, adhered thereto. The element can be prepared from a composition containing solid material dissolved or dispersed in a liquid medium by applying said composition to fibrous material which is partially embedded in one surface of a support and then drying to evaporate the liquid medium.

13 Claims, 2 Drawing Figures

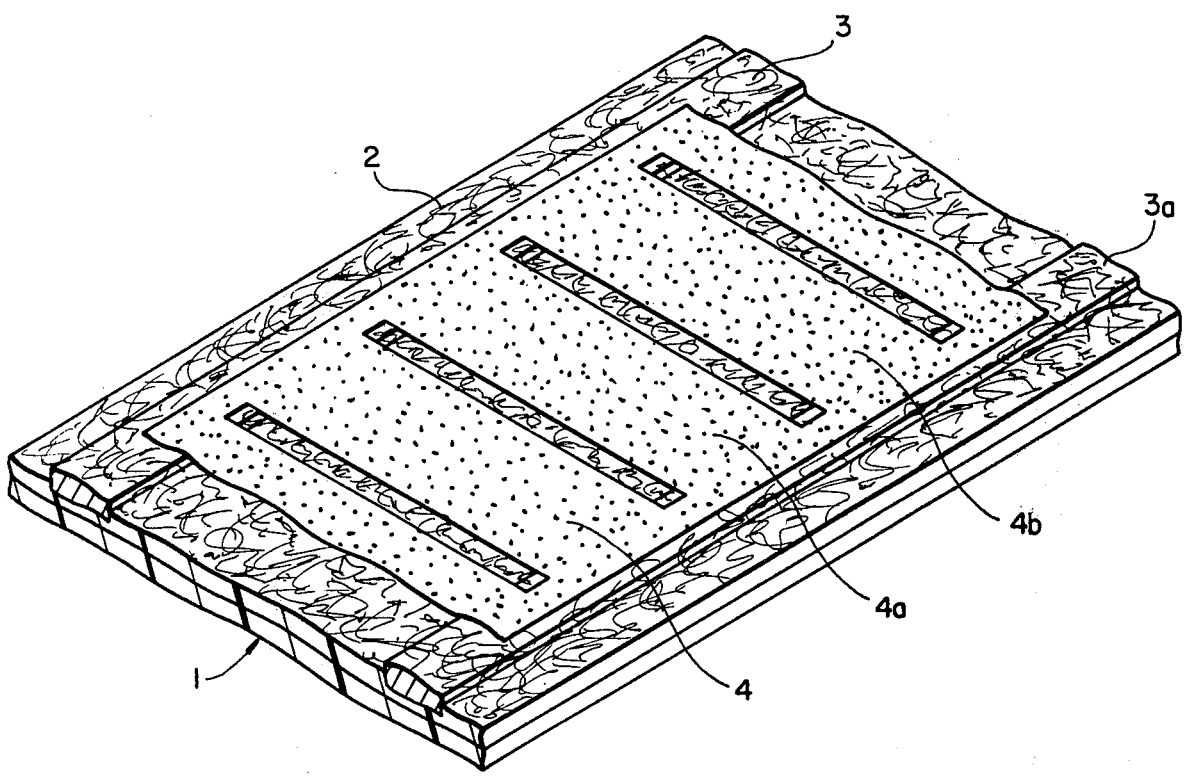
FIG_1

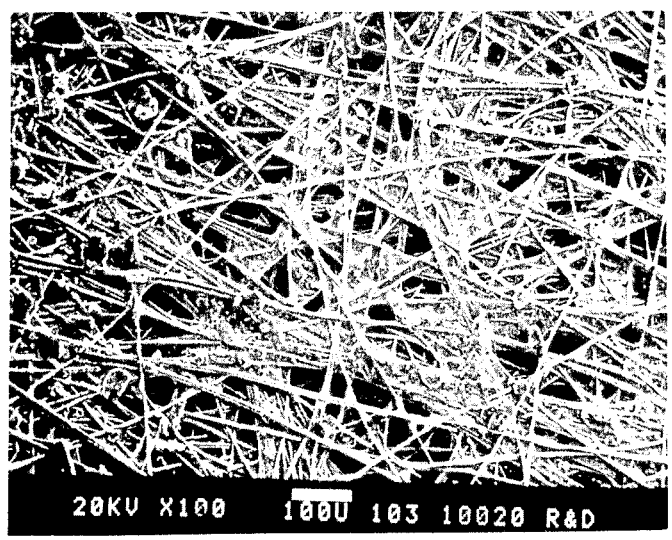

ELEMENTS COMPRISING FIBROUS MATERIALS

CROSS-REFERENCE TO RELATED APPLICATION

This application is related to my application entitled "Conductive Element" filed contemporaneously herewith and assigned to the same assignee Ser. No. 102,621, now abandoned in favor of a continuation-in-part application, Ser. No. 224,453.

BACKGROUND OF THE INVENTION

1. Field of the Invention

This invention relates to an element comprising solid material deposited onto fibrous material which is secured to one surface of a support.

2. Discussion of the Prior Art

Many processes, in particular printing processes, are known in which solid material is deposited onto a support, e.g. a polymeric film, in order to modify one or more of its properties, e.g. its appearance or its electrical properties. In such processes, the solid material may be applied to the support as a solution or a dispersion in a suitable liquid medium which is subsequently removed, leaving the solid material in place. While satisfactory results can be achieved in this way, there are many combinations of supports and solid materials which are insufficiently compatible to give entirely satisfactory results, especially when the support is flexible. One important class of products which can be produced in this way are conductive elements.

Conductive elements comprising laminates of a porous electrically conductive layer composed of electrically conducting particles bonded together in an open continuous structure, electrodes on the conductive layer in electrical contact therewith and at least one layer covering each surface of the conductive layer are disclosed in U.S. Pat. No. 2,952,761 to R. Smith-Johannsen. Numerous methods for the preparation of similar elements for use as heaters are disclosed in the prior art. See, for example, U.S. Pat. Nos. 2,803,566, 2,891,228 and 2,991,257 all to R. Smith-Johannsen, 3,900,654 to H. J. Stinger, 3,400,254 to Takemori and 3,876,968 to R. D. Barnes et al. The disclosures of the above patents are incorporated by reference herein.

In the prior art processes the conductive composition is applied to a substrate, for example, asbestos fiber mat, glass fabric or thermoplastic film. The structure is then generally laminated to one or more outer layers. When the conductive composition is an aqueous based dispersion of conductive particles, as in above-mentioned U.S. Pat. No. 2,952,761, the substrate used in actual practice has generally been an asbestos fiber mat, although use of other substrates is suggested in this patent. When the conductive composition is one containing an organic solvent medium, a wider range of substrates, including thermoplastic films, can be used. For example, in U.S. Pat. No. 3,900,654, a heating element is prepared from a thermoplastic film support with an adherent conductive layer of an electrically conductive material containing carbon black dispersed in a fluorocarbon elastomer. It is mentioned that the support can be composed of a layer of the polymer adhered to another material such as a fibrous sheet. It is also mentioned that the conductive elastomer can be applied from a liquid coating composition in which the elastomer is dispersed in an organic solvent or in water. Conductive elements prepared by processes of the type described above are not entirely satisfactory. In particular, when the support is not adequately wetted by the liquid composition comprising conductive particles, so-called "mud-cracking" of the conductive layer can take place when the liquid composition is dried, resulting in unstable electrical properties, especially when the support is flexible. While a very useful product can be made by impregnating a uniform asbestos fiber mat with an aqueous dispersion of conductive particles, careful precautions are necessary in handling products including asbestos fibers, and attempts to replace the uniform asbestos fiber mat by other uniform fiber mats have not yielded satisfactory products.

SUMMARY OF THE INVENTION

I have now discovered that improved results can be obtained in processes and products in which solid material is deposited on an element, by making use of an element which comprises a support and fibrous material which is secured to the support and which protrudes therefrom, at least a portion of the fibrous material which protrudes from the support forming part of a layer comprising randomly distributed fibers onto which the solid material is deposited, said support being physically and/or chemically different from the fibrous material.

In one aspect, the invention provides an element comprising a support which comprises a continuous film of polymeric composition and fibrous material which is secured to the support and which protrudes therefrom, at least a portion of the fibrous material which protrudes from the support being a part of a layer comprising randomly distributed fibers having particulate material adhered thereto.

In another aspect, the invention provides an element comprising a support and fibrous material which is secured to the support and which protrudes therefrom, at least a portion of the fibrous material which protrudes from the support being a part of a layer comprising randomly distributed fibers having solid material coated thereon, said solid material being chemically different from said fibers and being coated thereon in such quantity that the layer has a plurality of randomly distributed voids therein, subject to the proviso that if both the support and the fibrous material consist essentially of randomly distributed fibers, and the fibers in the support and in the fibrous material are the same, the packing density of the fibers in the support is substantially greater than it is in the fibrous material.

In another aspect, the invention provides a conductive element comprising a support and fibrous material which is secured to the support and which protrudes therefrom, at least a portion of the fibrous material which protrudes from the support being a part of a conductive layer comprising randomly distributed fibers having conductive material adhered thereto, subject to the proviso that if both the support and the fibrous material consist essentially of randomly distributed fibers, and the fibers in the support and in the fibrous material are the same, the packing density of the fibers in the support is substantially greater than it is in the fibrous material. Preferred conductive elements of the invention are heating elements which further comprise at least two spaced-apart electrodes which can be connected to a source of electrical power and which when so connected cause current to pass through the conductive layer.

In another aspect, the invention provides a process for modifying an element comprising a support which comprises a continuous film of a polymeric composition and fibrous material which is secured to the support and which protrudes therefrom, at least a portion of the fibrous material which protrudes from the support providing an outer surface of the element and comprising randomly distributed fibers, which process comprises (a) applying to said surface a liquid coating composition comprising a dispersion of solid particles in a liquid carrier and (b) removing the liquid carrier from the applied coating composition.

In another aspect, the invention provides a process for the preparation of a conductive element which comprises depositing conductive material onto an element comprising a support and fibrous material which is secured to the support and which protrudes therefrom, at least a portion of the fibrous material which protrudes from the support providing an outer surface of the element and comprising randomly distributed fibers onto which said conductive material is deposited to provide a conductive layer, subject to the proviso that if said conductive material is deposited on said randomly distributed fibers in the form of a liquid composition, the support is substantially less permeable to said liquid composition than the fibrous material.

BRIEF DESCRIPTION OF THE DRAWINGS

FIG. 1 shows a cross-sectional view of a heating element in accordance with this invention.

FIG. 2 is a photomicrograph of a surface of a conductive layer of a conductive element of the invention.

DETAILED DESCRIPTION OF THE INVENTION

The invention is particularly useful in relation to conductive elements, in which the solid material deposited on the fibers is electrically conductive, and in describing the invention, emphasis will be laid on such conductive elements. It is to be understood, however, that where the description refers to procedures and materials in relation to conductive elements, these are also applicable, where appropriate, to the other elements of the invention and their preparation.

The support of the element of this invention can be flexible or rigid and can be for example a film, block, slab or other shaped article. Preferably the support is sufficiently flexible for the element to be bent without breaking through an angle of at least 90° around a mandrel having a diameter of 6 inches. It is also preferred that, when the support is flexible, the neutral bending axis of the element passes through the coated layer (i.e. the layer of randomly distributed fibers having solid material deposited thereon); such preferred elements may for example further comprise a flexible layer of electrically insulating material remote from the support.

A wide variety of supports can be used in this invention. Often the support will comprise at least one continuous film of a polymeric material. Since the fibrous material must be secured to the support, it is preferred that part of the fibrous material is embedded in a layer of a polymeric composition which provides at least one surface portion of the support. The support can be entirely of a single composition, with the fibrous material partially embedded in one surface portion thereof. For example, the support can be of a thermoplastic material which when heated softens so that fibers can be impressed into the surface. Alternatively and preferably, the support can be a composite structure comprising a backing, preferably a continuous layer of a film-forming polymeric composition, and an adherent layer of a polymeric composition, which is preferably also a film-forming composition, in which the fibrous material is partially embedded. Preferably the adherent layer has a melting point lower than the backing, so that there is no danger of the support losing its structural integrity when the adherent layer is heated to a temperature which permits fibrous material to become embedded in it. The adherent layer may be composed of a thermoplastic polymeric composition which comprises a single polymer or a mixture of polymers, for example an adhesive, preferably a hot-melt adhesive.

Suitable polymeric materials for the backing and any layer adherent thereto include polyethylene, polypropylene, polyvinyl chloride, polyvinyl fluoride, polyvinylidene chloride, polyvinylidene fluoride, polytetrafluoroethylene, polyethylene terephthalate, polyethylene sebacate, polyhexamethylene adipamide, poly-epsilon-caprolactam, polymethyl methacrylate, polyepoxides, phenol-formaldehyde resin, rubber, ethylene-propylene rubber, ethylene-propylene-diene terpolymer rubber, acrylonitrile-butadiene-styrene terpolymers, and other homo-, co- and terpolymers. A preferred support is a flexible laminate of polyethylene terephthalate backing with polyethylene film laminated thereto.

The support can be substantially free of all fibers, or at least of randomly distributed fibers, except of course for fibers from the fibrous material, but fiber-reinforced polymeric films can be used as supports or components of supports. Often the support will be substantially impermeable to water and/or will be an electrical insulator.

Suitable fibers for the fibrous material include glass fibers, which are preferred and which preferably have an average diameter of 3 to 50 microns, cotton, paper and other cellulosic fibers, ceramic fibers and the like. The fibers will generally be chemically different from the support. The fibrous material preferably consists essentially of randomly distributed fibers, especially a random spun web of glass fibers. The thickness of the fibrous material is preferably 0.003 to 0.025 inch, especially 0.005 to 0.010 inch. The fibrous material need not be a coherent web or fabric but can consist of fibers individually embedded in the surface of the support. This can be achieved, for example, by applying a layer of adhesive on the surface of the support and then applying individual fibers by a flocking process.

The fibrous material is preferably partially embedded in the surface of the support so as to provide a fibrous layer in which, in at least the outer section of the layer, i.e. the section providing the surface of the layer remote from the support, and preferably throughout the layer, at least a substantial proportion, and preferably substantially all, of the fibers are randomly distributed, so that at least in the absence of the solid material, they define a plurality of randomly distributed voids. It is believed that, at least in some cases, the fibers, in the absence of the solid material, have a sufficient degree of free movement relative to each other to permit changes in the shapes of the voids when a liquid composition comprising the solid material is applied to the layer during preparation of the element.

The solid material adhered to the randomly distributed fibers of the fibrous material can be deposited thereon in any appropriate way, but is preferably applied to the fibers in the form of a liquid composition comprising the solid material dissolved or dispersed in a suitable aqueous or organic liquid medium, which is subsequently evaporated, preferably with the aid of heat, leaving the solid material, e.g. conductive particles, adhered to the fibers. However, the invention also contemplates the use of liquid compositions which at least in part solidify, either by cooling from an elevated temperature at which the liquid composition is applied and/or by chemical reaction after the liquid composition has been applied. More than one coating of the liquid composition can be applied to the fibrous material, the first coating optionally being dried before the second coating is applied. The compositions applied can be the same or different.

The solid material is preferably deposited on the fibers so that the layer has a plurality of randomly distributed voids therein. The voids can be open and/or closed cells. It is also preferred that there are randomly distributed fibers throughout the thickness of the layer.

A particularly preferred liquid composition for the preparation of conductive elements comprises particles selected from the group consisting of graphite, carbon black and mixtures thereof dispersed in an aqueous medium containing a suitable binder for said particles. Such compositions are disclosed in U.S. Pat. No. 2,803,566 to Robert Smith-Johannsen which is hereby incorporated by reference. The conductive compositions disclosed in this patent comprise an aqueous dispersion of particles of electrically conductive material and an alkali-stabilized colloidal silica in the form of dispersed particles having a particle size of 1 to 100 millimicrons. The conductive particles are preferably carbon black. Other conductive compositions wherein the conductive particles are graphite and/or carbon black are well known and can be used in preparing the conductive element of this invention. When an aqueous dispersion is used, and especially when the fibrous material is glass, the fibrous material can advantageously be washed with an aqueous solution containing a cationic wetting agent before applying the dispersion. The wetting agent conditions the surface of the fibers and promotes adhesion between them and the anionic particles of the conductive composition. The average thickness of the conductive coating on the fibers is from about 10 to about 200 microns.

Another class of coating compositions which can be used are conventional printing inks. Printing inks generally comprise a mixture of a colorant, such as a dye or pigment, dispersed or dissolved in a vehicle or carrier which comprises an organic solvent or water containing a suitable binder. Typically, the binder comprises rosin derivatives, ethylcellulose, nitrocellulose, polyamides, chlorinated rubber, various synthetic resins or the like. Organic solvents, which can be used include aliphatic hydrocarbons such as hexane, alcohols, aromatic hydrocarbons such as toluene or xylene, and the like.

The liquid coating compositions can be applied by conventional techniques, for example by painting, spraying, printing, silk screen printing, gravure printing, and the like. Printing the composition onto the fiber-modified surface permits accurate control of the amount of composition applied, and is a preferred method for producing the element of this invention. The coating composition can be applied substantially uniformly over the fiber-modified surface of the support or different properties can be conferred on different parts of the element by applying the composition in a predetermined pattern onto the surface and/or by varying the composition used in different areas. This is especially useful when conductive compositions are used to produce heating elements. The heat capacity of a heater is generally expressed in terms of power output per unit area of the heater and is often referred to as the watt density, and it depends upon the nature and concentration of the conductive particles, the type and amount of binder, the ratio of binder to conductive particles, and the thermal and processing history of the composition. The resistance of the conductive layer in the conductive elements of this invention is preferably in the range from about 10 to about 150,000 ohms per electrical square. The power output of heating elements depends on the voltage applied.

In the heating elements of this invention, at least two electrodes are in electrical contact with the conductive layer. The electrodes can be placed on the surface of the support before the fibrous material is partially embedded into the surface of the support. During the step of embedding the fibrous material the electrodes can also become partially embedded in the support. The fibrous material can be applied over the electrodes as well as the exposed surface of the support, in which case the liquid composition penetrates through the fibrous material into contact with the electrodes. Alternatively, the electrodes can be placed on top of the fibrous material prior to application of the liquid composition. It is also possible to place the electrodes in contact with the conductive layer after it has been formed; the electrodes can be bonded to the conductive layer using an electrically conductive adhesive, such as an adhesive comprising an epoxy or polyester resin containing conductive particles such as graphite, carbon black or powdered metal.

The electrodes are preferably strip electrodes of plain or expanded metal, for example, nickel, copper, silver, platinum, aluminum, or stainless steel, etc. Electrodes of expanded nickel or copper are particularly preferred. Mesh electrodes can also be used. Other highly conductive materials can be used, for example highly conductive polymer compositions containing carbon black and/or graphite to impart sufficient conductivity. Wire conductors can be used if sufficient contact with the conductive layer is obtained. One way of achieving this is to paint over the wire and adjacent conductive layer with a conductive paint such as silver or aluminum paint.

When the electrodes are connected to a source of electrical power, current flows through the conductive layer, producing resistive heating. The source of electrical power can, for example have an electrical potential of about 12 to about 600 volts. Preferably the potential is 110 or 220 volts for many uses of the heating element. The operating temperature of the heating element can be up to about 300° F. and even higher. Since the support and fibrous material must be able to withstand the heat generated by the heater, the operating temperature must be considered in selecting the support and fibrous material.

The conductive elements of this invention are useful not only as heaters, but also for other uses, including uses in which electrodes are unnecessary, for example as microwave detectors, RFI/EMI (radio frequency interference/electromagnetic interference) shielding in stereo systems and the like, carbon electrodes for electrochemical processes, such as waste water treatment and electroplating, as printed circuit boards, and as static electricity bleeders, e.g. for carpets, conveyor belts, belt sanders, etc., or the like.

The following example illustrates a preparation of a heating element in accordance with this invention.

EXAMPLE

A conductive particle composition is prepared by the following procedures.

A conductive mix is prepared by mixing 260 parts of acetylene black having an average particle size of 42 millimicrons, commercially available as Shawinigan acetylene black, and 140 parts of oil furnace carbon black having an average particle size of 30 millimicrons, commercially available as Vulcan XC-72, in sufficient water to give the composition a 19% solids content. The conductive mix is then allowed to age at least one day.

A first premix is prepared by blending the following ingredients in a homogenizing high shear mixing tank:
200 parts: aqueous colloidal silica sol containing 40% silica, commercially available as Ludox HS-40,
59 parts: acrylic latex adhesive comprising a copolymer of ethyl and butyl acrylate, commercially available as AC-61X,
Ammonium hydroxide to adjust the pH to about 9.9 and
17 parts: deionized water.

To this mixture is added 128 parts of deionized water containing 3 parts of dicyandiamideformalde condensate, which is a cationic wetting agent commercially available as Warcofix. The first premix is then allowed to age overnight.

Binder A is prepared by mixing 204 parts of first premix with 68 parts of bentonite clay. The resulting mix is permitted to age at least 24 hours.

Binder B is prepared by mixing 200 parts of the aqueous colloidal silica sol, 126 parts of the acrylic resin adhesive and ammonium hydroxide in an amount to adjust the pH to about 9.9. To this mixture is then added 88 parts of deionized water containing 5 parts of the cationic wetting agent. The mixture is permitted to age 24 hours.

The conductive particle composition is prepared by mixing 50 parts of Binder A, 50 Parts of Binder B and then adding 100 parts of conductive mix. The resulting mixture is then ready for use.

Two strips of expanded nickel, 0.5 inches wide and 0.005 inches thick, are placed parallel to the edges along the length of the polyethylene surface of a flexible strip comprising a laminate of polyethylene terephthalate 5 mils thick, and polyethylene, 2 mils thick. Fibrous material in the form of a random spun web, 3 mils thick, of glass fibers, having an average diameter of 3.8 microns, is placed over the polyethylene surface and the nickel strips and is embedded in the polyethylene layer by application of heat and pressure. The surface is then washed to remove loose fibers using a solution of 99.8 parts deionized water, 0.1 parts of a cationic charge modifying agent, Warcofix, and 0.1 parts of a nonionic surfactant, commercially available as Triton CF10.

The conductive composition is silk screen printed onto the surface using a 200 mesh screen. Two coats of the composition are applied to ensure complete coverage. The second coat is applied before the first coat is dried. The conductive composition makes electrical contact with the two metal strip electrodes and extends completely over the area between the metal strips. The composition is allowed to dry and a top layer of a flexible laminate of polyethylene terephthalate and polyethylene film is laminated to the conductive composition and support. The heating element has a resistance of about 500 ohms per square, and when connected to 110 volt supply has a watt density of about 24 watts per square.

FIG. 1 illustrates the heating element prepared in accordance with this invention. In FIG. 1, a flexible support, 1, consists of a laminate of polyethylene terephthalate and polyethylene. A random spun web of glass fibers, 2, is partially embedded in the polyethylene surface of the support as described in the above example. Copper strip electrodes, 3 and 3a, are placed on the surface prior to embedding the web. An aqueous conductive particle composition is then printed onto the surface in a pattern which is continuous over the electrodes and in the form of panels, 4, 4a, 4b, over the fibrous material of the web in the area between the electrodes. The panels can be positioned as far apart as desired to create heat/non-heat areas on the surface of the support. When uniform heat along the length of a heater is desired the conductive composition can be applied substantially uniformly over the fibrous material. However, it is also possible to provide relatively uniform heat along the length of the heater by printing discontinuous panels as above with minimal spacing between them. The discontinuity prevents propagation of a fault condition from one panel to the next. As is well known in flat flexible heaters of this type, if a fault or burn out occurs in the heater, the fault tends to propagate along the length of the heater.

The individual panels of a heater of the type shown in FIG. 1 can be printed with conductive compositions of different watt densities. In this way the amount of heat generated in the separate panels will vary. By appropriate selection of the conductive composition, the heat generated along the length of the heater can be varied in a preselected manner. It is also possible to apply more than one coat of the conductive composition either uniformly along the heater or in a preselected pattern, thereby also selectively controlling the heat that will be generated along the heater. If more than one coat of conductive composition is applied, either over the entire surface of the heating element or any desired portion thereof, the second and successive coats should preferably be applied before the immediately preceding coat has dried. As will be readily apparent, shapes other than panels can be printed onto the fiber-modified surface of the support. Also, the shape of the heater can be varied by selecting a support of the desired shape. Generally, a flexible support in the form of a strip with electrodes positioned relatively close to and parallel to the edges will be used. However, non-flexible supports can be used, if desired. Also, both flexible and non-flexible supports in shapes other than strips can be used.

It is also possible to secure fibrous material to more than one surface of the support. Elements of this invention can be laminated together creating a layered structure if desired. As will be readily apparent, different compositions and/or different printed patterns of composition can be applied to create the desired effect.

What is claimed is:

1. A process for modifying an element comprising a support which comprises a continuous film of a polymeric composition and fibrous material which is secured to the support and which protrudes therefrom, at least a portion of the fibrous material which protrudes from the support providing an outer surface of the element and comprising randomly distributed fibers, which process comprises (a) applying to said surface a liquid coating composition comprising a dispersion of solid particles in a liquid carrier and (b) removing the liquid carrier from the applied coating composition.

2. A process according to claim 1 wherein said liquid composition is an aqueous dispersion.

3. A process according to claim 1 wherein said liquid carrier is an organic liquid.

4. A process according to claim 1 wherein said liquid composition is applied to the element by a printing process.

5. A process according to claim 4 wherein said liquid composition is applied to the element by silk screen printing.

6. A process according to claim 4 wherein the liquid composition is applied to the element in a discontinuous pattern.

7. A process according to claim 1 wherein said support comprises a continuous film of a polymeric composition and said fibrous material consists essentially of randomly distributed fibers.

8. A process according to claim 2 wherein said support comprises a continuous hydrophobic film of a polymeric composition and said fibrous material consists essentially of randomly distributed fibers.

9. A process according to claim 8 wherein said fibrous material is a random spun web of glass fibers having an average diameter of 3 to 50 microns, the web having a thickness of 3 to 25 mils.

10. A process according to claim 1 wherein the fibrous material is 0.003 to 0.025 inch thick.

11. A process according to claim 1 wherein the support is substantially impermeable to water.

12. A process according to claim 1 wherein the support is a laminate comprising a first continuous layer of a first film-forming composition which is free from fibrous material and a second layer of a second polymeric composition which has said fibrous material partially embedded therein.

13. A process according to claim 1 wherein the liquid coating composition is applied to the support in a quantity such that, after the liquid carrier has been removed, at least a portion of the fibrous material which protrudes from the support is part of a layer comprising randomly distributed fibers having said solid particles coated thereon in such quantity that the layer has a plurality of randomly distributed voids therein.

* * * * *